United States Patent [19]
McFarland

[11] Patent Number: 5,815,017
[45] Date of Patent: Sep. 29, 1998

[54] FORCED OSCILLATOR CIRCUIT AND METHOD

[75] Inventor: Duncan A. McFarland, Tempe, Ariz.

[73] Assignee: Motorola, Inc., Schaumburg, Ill.

[21] Appl. No.: 808,772

[22] Filed: Mar. 3, 1997

[51] Int. Cl.$^6$ .............................. H03L 7/06; H03H 11/26
[52] U.S. Cl. ..................... 327/158; 327/160; 327/161; 327/241; 327/278; 327/279; 327/299
[58] Field of Search ........................... 327/238, 241, 327/278, 279, 158, 160, 161, 299

[56] References Cited

U.S. PATENT DOCUMENTS 4,780,681  10/1988  Dahlman ................................ 327/241

Primary Examiner—Margaret Rose Wambach
Attorney, Agent, or Firm—Robert D. Atkins; Robert F. Hightower

[57] ABSTRACT

An integrated circuit and method produce a first clock signal (CLOCK) from a reference clock (REFCLK) but at a different frequency. A variable delay line (32) produces the first clock signal by introducing a variable delay in the reference clock signal that is controlled by a programming signal generated in a counter (34). The programming signal is incremented by a second clock signal (UP) while transitions of a fixed delay clock signal lead transitions of the first clock signal. When the programming signal reaches the count of a rollover code (ROLLOVER), the programming signal is reset to a zero count to begin a new sequence. A calibration circuit (36, 38, 40, 42) determines the count of the programming signal needed to produce the rollover code when the variable delay is at least as great as one period of the reference clock signal.

17 Claims, 2 Drawing Sheets

FORCED OSCILLATOR CIRCUIT AND METHOD

BACKGROUND OF THE INVENTION

The present invention relates, in general, to integrated circuits, and more particularly to variable frequency clock circuits.

In many clock and data recovery applications a clock signal in a receiver must be synchronized to transmitted data. For example, a fibre channel network is a high speed network communication system designed for asynchronous high speed data transfers at a specified rate of about 1.0625 gigabits per second within a tolerance of plus or minus 200 parts per million. The fibre channel network has no system master clock, so data transmissions at each node are synchronized to a highly stable reference oscillator in the node, which is typically crystal-controlled. The timing of the transmitter clock is revealed to the receiver through bit transitions of the incoming data which are detected by the receiver and used to synchronize the receiver clock to the transmitted data. The receiver continuously monitors the transitions and evaluates the captured data in order to detect at what point in the bit cycle the data is being sampled.

The receiving node's reference oscillator provides a stable reference frequency with a high degree of noise immunity. However, the reference frequencies of the transmitter and receiver typically are not equal. Thus, the receiving clock is not synchronized to the transmitted incoming data. Prior art receiver clocks detect the logic transitions and produce control signals to set the frequency of a voltage controlled oscillator (VCO). However, a VCO is susceptible to frequency pulling caused by extraneous signals such as power supply noise and variations in the integrated circuit substrate voltage.

Hence, a circuit and method are needed for producing a receiver clock that is derived from a stable reference oscillator with high noise immunity and whose frequency can be adjusted to synchronize to the transmitted data.

DETAILED DESCRIPTION OF THE DRAWINGS

Figure 1:
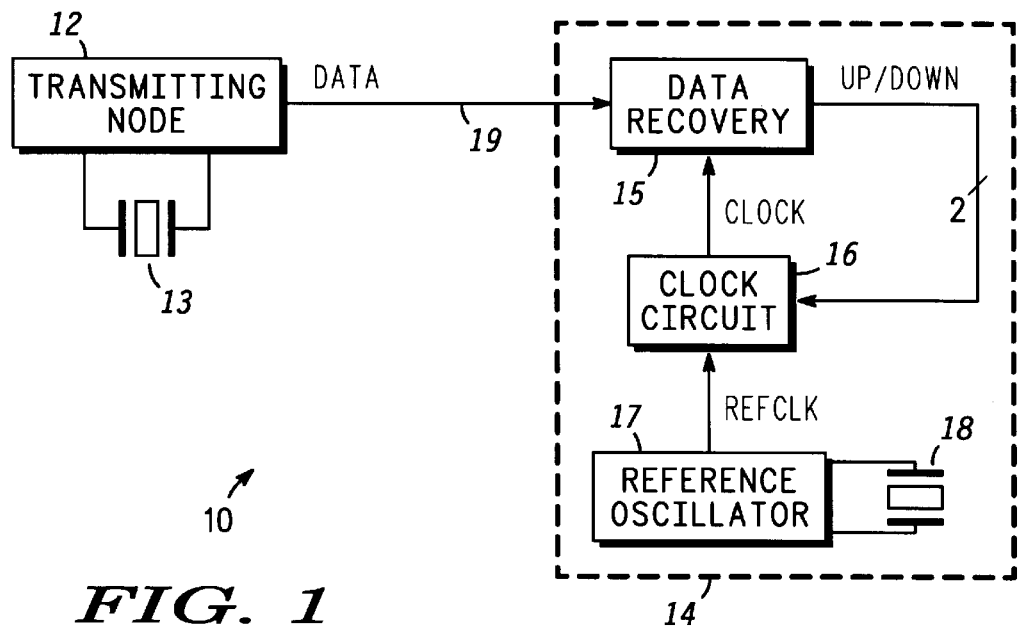
FIG. 1 is a block diagram of a fibre channel network.

FIG. 1 is a block diagram of a fibre channel network 10 including a transmitting node 12 and a receiving node 14. Transmitting node 12 includes a reference oscillator that generates a reference clock whose frequency $F_{TX}$ is set by the resonant frequency of crystal 13. Frequency $F_{TX}$ is nominally 106.25 megahertz, which varies in accordance with manufacturing tolerances of crystal 13. A frequency synthesizer in transmitting node 12 synchronizes DATA signals transmitted at a nominal frequency of 1.0625 gigabits per second to the transmitter's reference clock. DATA is transmitted along a conductor 19 to receiving node 14.

Receiving node 14 includes a data recovery circuit 15, a clock circuit 16 and a reference oscillator 17. Reference oscillator 17 is typically a crystal-controlled oscillator with a high Q to provide a high degree of frequency stability and noise immunity. Reference oscillator 17 generates a reference clock REFCLK whose resonant frequency $F_{RX}$ is nominally $F_{RX}$=106.25 megahertz as determined by a crystal 18. However, frequency $F_{TX}$ typically does not equal frequency $F_{RX}$ due to manufacturing variations of crystals 13 and 18.

Clock circuit 16 and data recovery circuit 15 operate as a clock recovery circuit that senses bit transitions of DATA and produces an UP or a DOWN control signal to adjust a CLOCK signal used to time the DATA samples. DATA is preferably sampled at the midpoint between bit transitions where DATA is most stable and where noise immunity is high. When DATA is sampled near bit transitions, the DATA signals are less stable and have lower noise immunity, so the likelihood of data errors is increased. When CLOCK operates at a different frequency than DATA, DATA is sampled at varying points throughout a bit cycle of the DATA bits, including near bit transitions where sampling errors are generated at an increased rate.

Therefore, accurate DATA capture requires the frequency of CLOCK to equal $F_{TX}$. Such frequency equalization is provided by data recovery circuit 15, which uses an oversampling technique to determine from the oversampled data whether DATA is being sampled near bit transitions.

Figure 2:
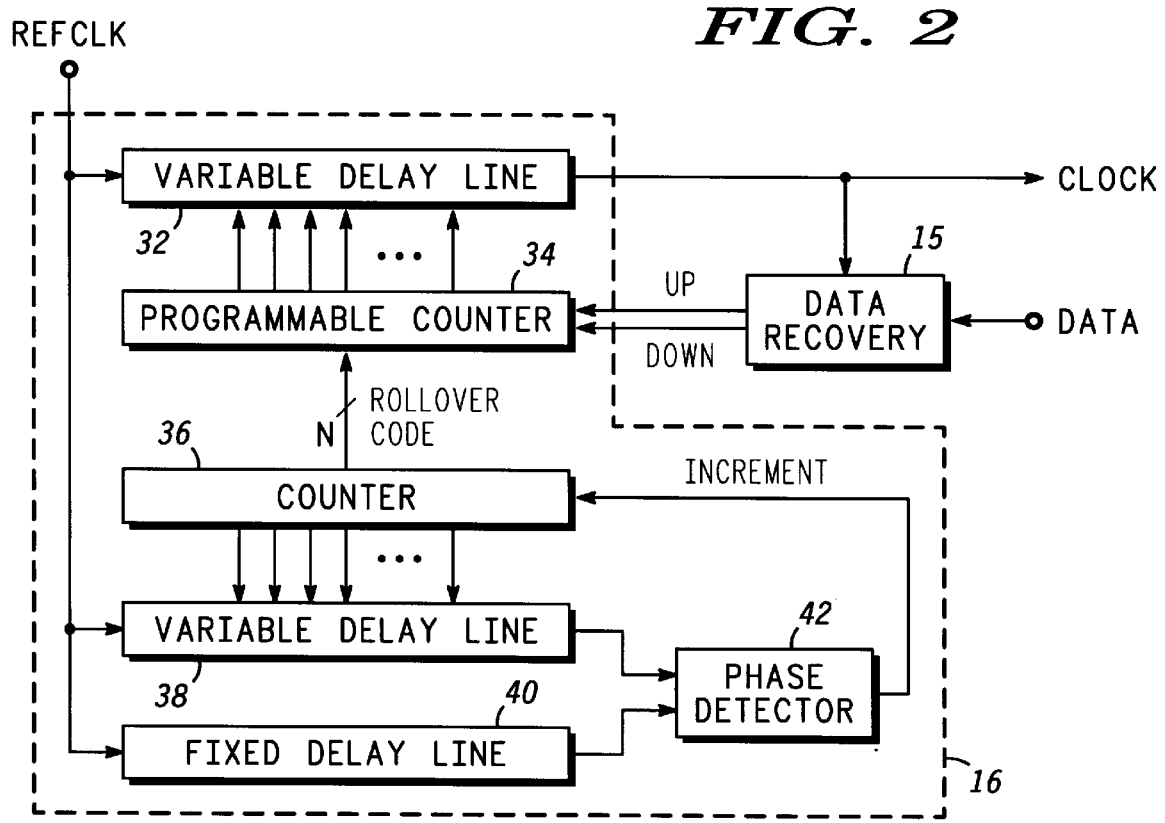
FIG. 2 is a block diagram of a clock recovery circuit.

FIG. 2 is a block diagram of a clock recovery circuit fabricated as an integrated circuit, including data recovery circuit 15 and clock circuit 16. Clock circuit 16 includes a variable delay line 32, a programmable counter 34, a counter 36, a variable delay line 38, a fixed delay line 40 and a phase detector 42.

Variable delay line 32 is a digitally controlled delay line that introduces a variable delay in pulses of REFCLK that is controlled by a binary programming signal received from programmable counter 34. The delayed REFCLK pulses are produced as pulses of CLOCK at an output of variable delay line 32. In one embodiment, variable delay line 32 is implemented as a series of delay stages, each of which includes a logic gate that introduces an incremental delay in REFCLK. The sum of the incremental delays of the stages produces the overall variable delay in CLOCK pulses. A decoder included in variable delay line 32 receives the binary programming signal to determine which delay stage is selected to provide CLOCK at the output.

In an alternative embodiment, each of the delay stages includes a logic gate loaded by a binary-weighted array of switchable capacitors that are enabled or disabled by the binary programming signal. The switchable capacitors produce a load capacitance on the logic gates which introduces a proportional delay in REFCLK pulses for producing CLOCK pulses after the proportional delay. Variable delay line 32 provides a maximum variable delay greater than at least one period of REFCLK. For example, if REFCLK has a period of ten nanoseconds, variable delay line 32 produces a maximum variable delay of at least ten nanoseconds.

Data recovery circuit 15 typically uses oversampling techniques to sample incoming DATA signals and determine whether the frequency of CLOCK needs adjustment. Data recovery circuit 15 includes a frequency multiplier that synchronizes CLOCK pulses to provide DATA sampling transitions at the nominal DATA frequency of 1.0625 gigahertz. When a frequency adjustment of CLOCK is needed, data recovery circuit 15 asserts either an UP control signal or a DOWN control signal as appropriate to increment or decrement programmable counter 34 to modify the variable delay of variable delay line 32.

Programmable counter 34 is an N-bit up/down binary counter that is incremented when an UP control signal is received and decremented when a DOWN control signal is received. Integer N is determined from the period of REFCLK and the incremental delay resolution of variable delay line 32. For example, if the period of REFCLK is ten nanoseconds and an incremental delay resolution of 100.0 picoseconds is desired, then integer N=7 and programmable counter 34 has seven stages that count to at least (10 nanoseconds/100 picoseconds)=100. Programmable counter 34 has parallel data inputs that receive an N-bit ROLLOVER CODE on an N-bit bus from counter 36. When programmable counter 34 reaches a count equal to ROLLOVER CODE, programmable counter 34 is reset to a zero count.

Counter 36, variable delay line 38, fixed delay line 40 and phase detector 42 operate as a calibration circuit that calibrates clock recovery circuit 16 to adjust ROLLOVER CODE to account for manufacturing variations in the incremental delay of variable delay line 32.

Variable delay line 38 is matched to variable delay line 32 using standard integrated circuit matching techniques. Therefore, equal values of the respective binary programming signals produced by programmable counters 34 and 36 produce equivalent variable delays through variable delay lines 32 and 38. Variable delay line 38 produces a variable delay clock signal at an output.

Counter 36 is an N-bit binary up counter that is incremented when an INCREMENT control signal is received from an output of phase detector 42. Counter 36 has one N-bit output that produces ROLLOVER CODE and another N-bit output that produces a binary programming signal to set the delay of variable delay line 38. The binary programming signal is typically equal to the value of ROLLOVER CODE. The value of ROLLOVER CODE represents a delay through variable delay line 38 of at least one period of REFCLK.

Fixed delay line 40 is matched to variable delay lines 32 and 38 using standard integrated circuit matching techniques. However, fixed delay line 40 produces a fixed delay that is equivalent to the variable delays of variable delay lines 32 and 38 when the respective programming signals have a value of zero. Fixed delay line 40 produces a fixed delay clock signal at an output whose delay is equivalent to the minimum delays of variable delay lines 32 and 38.

Phase detector 42 is implemented as a two-input latch that detects transitions of the fixed delay and variable delay clock signals to produce an INCREMENT signal when the fixed delay clock signal is received before the variable delay clock signal. Phase detector 42 can also be implemented with an alternative configuration such as a digital multiplier.

The calibration circuit initially executes a self-calibrating loop with the calibration circuit as follows. A power-up reset or similar signal sets counter 36 to a non-zero value to force the variable delay through variable delay line 38 to be greater than the fixed delay through fixed delay line 40. Hence, the fixed delay clock signal reaches phase detector 42 before the variable delay signal, so phase detector 42 produces an INCREMENT pulse to increment counter 36. On successive cycles of REFCLK in which the fixed delay clock signal leads the variable delay clock signal, phase detector 42 produces other INCREMENT pulses which successively increase the variable delay. Eventually, the variable delay increases to a time greater than the period of REFCLK, such that the variable delay clock signal leads the fixed delay clock signal. On that cycle, no INCREMENT pulse is produced, so counter 36 retains the count as the ROLLOVER CODE. Thus, ROLLOVER CODE equals the value of the programming signal necessary to introduce a variable delay in variable delay line 38 that represents at least one period of REFCLK.

Figure 3:
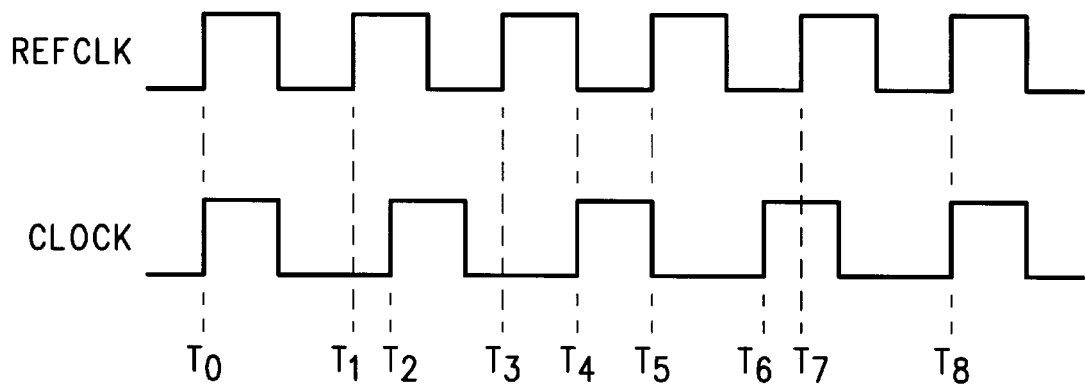
FIG. 3 is a timing diagram showing reference and clock signal waveforms.

The operation of the clock recovery circuit can be understood by referring to the timing diagram of FIG. 3, showing the timing waveforms for REFCLK and CLOCK. In order to simplify the description, assume programmable counter 34 is initially reset to a zero count that produces zero delay through variable delay line 32, so that REFCLK and CLOCK are aligned at time $T_0$ as shown. To further simplify, assume that DATA operates at a lower frequency than REFCLK, so that DATA transitions initially lag CLOCK transitions at the inputs of data recovery circuit 15. Further assume that ROLLOVER CODE has been calibrated to have a binary value equal to four.

On cycle zero, the transitions of REFCLK and CLOCK are aligned at time $T_0$, However, because DATA transitions lag REFCLK transitions, data recovery circuit 15 produces an UP control signal that increments programmable counter 34 to a count of one and adds an incremental delay to variable delay line 32.

On the next cycle, i.e., cycle one, the incremental delay of variable delay line 32 results in the transition of REFCLK at time $T_1$ producing a transition of CLOCK at time $T_2$, where the variable delay of variable delay line 32 is $T_2-T_1$. Data recovery circuit 15 produces a second UP control signal that increments programmable counter 34 to a value of two, which adds an incremental delay through variable delay line 32.

On cycle two, the incremental delay of variable delay line 32 results in the transition of REFCLK at time $T_3$ producing a transition of CLOCK at time $T_4$, where the variable delay of variable delay line 32 is $T_4-T_3$. Data recovery circuit 15 produces a third UP control signal that increments programmable counter 34 to a value of three, which adds a third incremental delay through variable delay line 32.

On cycle three, the incremental delay of variable delay line 32 results in the transition of REFCLK at time $T_5$ producing a transition of CLOCK at time $T_6$, where the variable delay of variable delay line 32 is $T_6-T_5$. Data recovery circuit 15 produces a third UP control signal that increments programmable counter 34 to a value of three, which adds a third incremental delay through variable delay line 32.

On cycle four, the REFCLK transition at time $T_7$ produces a CLOCK transition at time $T_8$, where the variable delay of variable delay line 32 is $T_8-T_7$. Data recovery circuit 15 produces a fourth UP control signal that increments programmable counter 34 to a value of four, which adds a fourth incremental delay through variable delay line 32.

At the end of cycle four, the programming signal has a value of four, which equals ROLLOVER CODE and represents a variable delay equal to one period of REFCLK. Hence, at time $T_8$, leading edges of REFCLK and CLOCK are again aligned. ROLLOVER CODE resets programmable counter 34 to a zero count to begin a new sequence at time $T_8$. As is seen from the timing diagram, five pulses of REFCLK are generated from time $T_0$ to time $T_8$ while only four pulses of CLOCK were produced. CLOCK therefore operates at a frequency different from that of REFCLK.

Clock recovery circuit 20 operates in a similar fashion when DATA operates at a frequency higher than that of REFCLK. However, transitions of DATA lead transitions of CLOCK. Therefore, data recovery circuit 15 produces DOWN control signals which decrement programmable counter 34 to reduce the delay through variable delay line 32 until the value of ROLLOVER CODE is reached and programmable counter 34 is reset to a zero count.

Figure 4:
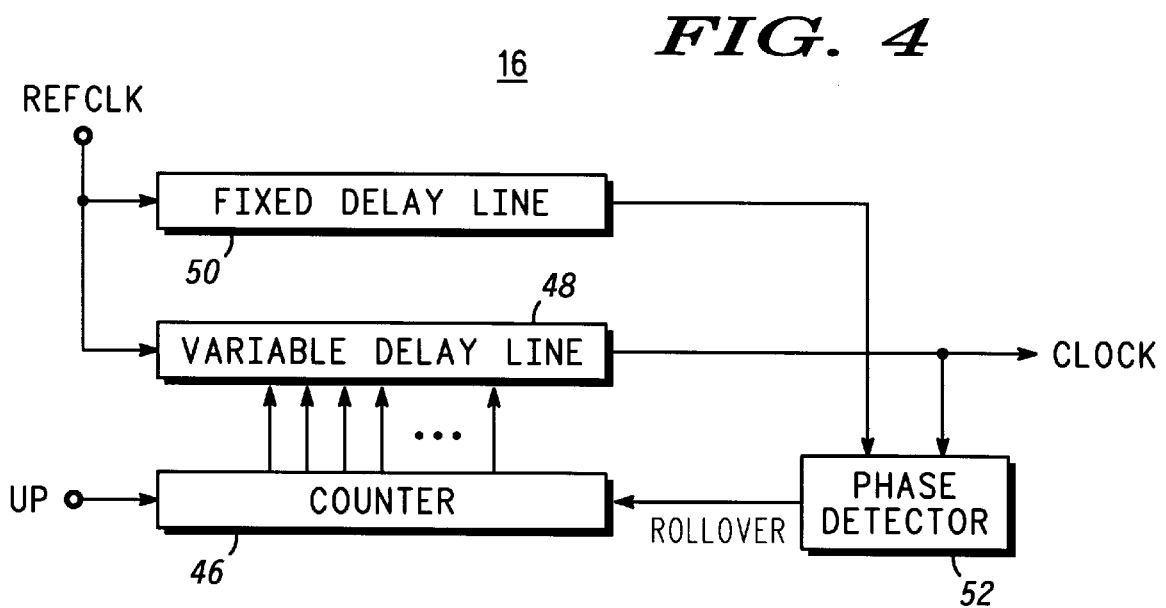
FIG. 4 is a block diagram of an alternate embodiment of a clock recovery circuit.

FIG. 4 is an alternate embodiment of clock circuit 16 that produces a CLOCK signal from a reference clock signal REFCLK such that CLOCK has a frequency different from the frequency of REFCLK. In particular, CLOCK is produced at a frequency derived from an UP clock signal and the incremental resolution, where the frequency of UP is lower than the frequency of REFCLK. Clock circuit 16 includes counter 46, variable delay line 48, fixed delay line 50 and phase detector 52.

Variable delay line 48 is a digitally controllable delay line that introduces a variable delay in REFCLK that is controlled by a programming signal from counter 46. Variable delay line 48 produces a variable delay CLOCK signal at an output. Variable delay line 48 produces a maximum variable delay which is greater than at least one period of REFCLK.

Counter 46 is an N-stage up counter whose output provides the programming signal to variable delay line 48. Integer N is determined by the period of REFCLK and the desired incremental delay resolution of variable delay line 38 as discussed above. Counter 46 is incremented by the UP clock signal. When a CLOCK signal is derived from REFCLK to operate at a higher frequency than REFCLK, the UP signal is replaced by a DOWN signal that decrements counter 46.

Fixed delay line 50 is matched to variable delay line 48 to introduce a fixed delay in REFCLK that is equal to the minimum variable delay of variable delay line 48 which occurs when counter 46 is reset to a zero count. A fixed delay clock signal is produced at an output.

Phase detector 52 is configured as a latch that responds to transitions of CLOCK and the fixed delay clock signal. Phase detector can alternatively be configured as a multiplier or other digital circuit that determines which of two input pulses is leading in phase. In particular, phase detector 52 produces a ROLLOVER signal at an output when the variable delay through variable delay line 48 reaches at least one period of REFCLK, at which time a CLOCK pulse arrives at one input of phase detector 52 before the fixed delay clock signal. ROLLOVER is coupled to a reset input of counter 46 to reset the programming signal to a zero value.

Operation of clock circuit 16 is seen by referring to the timing diagram of FIG. 3. For simplification, assume the variable delay of variable delay line 48 is greater than the period of REFCLK when programmable counter 46 reaches a count of three. Initially, transitions of CLOCK and REFCLK are aligned at time $T_0$.

On the first cycle, counter 46 is incremented by UP to produce a value of one in the programming signal, which incrementally increases the variable delay of variable delay line 48 such that a REFCLK transition at $T_1$ produces a transition of CLOCK at time $T_2$. The $T_1$ transition of arrives at the input of phase detector 52 before the $T_2$ transition of CLOCK, so phase detector 52 does not generate a ROLLOVER pulse on the first cycle.

On the second cycle, counter 46 is again incremented by UP to produce a programming signal with a value of two, which incrementally increases the variable delay of variable delay line 48 such that a REFCLK transition at time $T_3$ produces a leading edge of CLOCK at time $T_4$. The $T_3$ transition of REFCLK arrives at the input of phase detector 52 before the $T_4$ transition of CLOCK, so phase detector 52 does not generate a ROLLOVER pulse on the second cycle.

On the third cycle, UP increments counter 46 to produce a programming signal with a value of three, which again incrementally increases the variable delay of variable delay line 48 such that a REFCLK transition at time $T_5$ produces a CLOCK transition at time $T_6$. The $T_5$ transition of REFCLK arrives at the input of phase detector 52 before the $T_6$ transition of CLOCK, so phase detector 52 does not generate a ROLLOVER pulse on the third cycle.

On the fourth cycle, UP increments counter 46 to a count of four, which incrementally increases the variable delay of variable delay line 48 such that a REFCLK transition at time $T_7$ produces a leading edge of CLOCK at time $T_8$. At time $T_8$, however, a CLOCK transition is aligned with a REFCLK transition, so phase detector 52 produces a ROLLOVER signal that resets counter 46 to a count of zero to begin a new sequence.

As shown in FIG. 3, the present invention produces four CLOCK cycles between $T_0$ and $T_8$ in response to four cycles of UP. However, REFCLK produces five cycles between $T_0$ and $T_8$. Hence, CLOCK is generated from REFCLK but at a different frequency, which in this example is controlled by the frequency of UP.

By now it should be appreciated that the present invention provides a circuit and method of producing a first clock signal from a reference clock signal but which operates at a different frequency than the reference signal. A variable delay line produces the first clock signal by introducing a variable delay in the reference clock signal that is controlled by altering values of a binary programming signal generated in a programmable counter. A second clock signal operating at a different frequency than the reference signal increments the programming signal until a count equal to a rollover code is reached. The rollover code represents a variable delay of at least one period of the reference signal. The rollover code resets the programming signal to a zero count to begin a new sequence. The first clock signal is thereby produced from the reference clock signal at the frequency controlled by the second clock signal. A calibration circuit determines the count of the programming signal that is needed to produce the rollover code over a range of manufacturing variations.

I claim:

1. An integrated circuit, comprising:
    a variable delay line coupled for receiving a first clock signal and providing a variable delay clock signal in response to a programming signal;
    a phase detector having a first input coupled for receiving the variable delay clock signal and a second input coupled for receiving a fixed delay clock signal;
    a programmable counter having a control input coupled to an output of the phase detector, and an output for providing the programming signal; and
    a fixed delay line coupled for delaying the first clock signal to produce the fixed delay clock signal at an output.

2. The integrated circuit of claim 1, wherein the programmable counter has a clock input coupled for receiving a second clock signal.

3. The integrated circuit of claim 2, wherein a frequency of the second clock signal is less than a frequency of the first clock signal, and the second clock signal increments the programmable counter to increase a variable delay of the variable delay clock signal.

4. The integrated circuit of claim 3, wherein a control signal is produced at the output of the phase detector that resets the programmable counter to a zero count that adjusts the variable delay of the variable delay clock signal to equal a fixed delay of the fixed delay clock signal.

5. The integrated circuit of claim 4, wherein the control signal is produced when the variable delay is equivalent to at least one period of the first clock signal.

6. An integrated circuit, comprising:
   a first variable delay line coupled for receiving a first clock signal and providing a first variable delay clock signal in response to a first programming signal;
   a first programmable counter having an output for providing the first programming signal where the first programmable counter resets upon reaching a value of a rollover code; and
   a calibration circuit for setting the rollover code to represent at least one period of the first clock signal.

7. The integrated circuit of claim 6, wherein the calibration circuit includes:
   a second variable delay line coupled for receiving the first clock signal and providing a second variable delay clock signal in response to a second programming signal;
   a phase detector having a first input coupled for receiving the second variable delay clock signal and an second input coupled for receiving a fixed delay clock signal; and
   a counter having a clock input coupled to an output of the phase detector and a first output for providing the second programming signal.

8. The integrated circuit of claim 7, wherein the counter has a second output for providing the rollover code.

9. The integrated circuit of claim 8, wherein a control signal is produced at an output of the phase detector for incrementing the counter until a variable delay of the second variable delay line reaches said at least one period of the first clock signal.

10. The integrated circuit of claim 9, wherein the calibration circuit further comprises a fixed delay line having an input for receiving the first clock signal and an output for producing the fixed delay clock signal.

11. The integrated circuit of claim 10, wherein the first programmable counter has a clock input coupled for receiving a second clock signal.

12. The integrated circuit of claim 11, wherein a frequency of the second clock signal is greater than a frequency of the first clock signal, and the first programming signal is decremented by the second clock signal to reduce a variable delay of the first variable delay clock signal.

13. A method of modifying a clock frequency, comprising the steps of:
   delaying a first clock signal in response to a programming signal to produce a variable delay clock signal;
   detecting a phase difference between the variable delay clock signal and a fixed delay clock signal to produce a control signal; and
   altering values of the programming signal until reset by the control signal to produce a frequency of the variable delay clock signal different from a frequency of the first clock signal.

14. The method of claim 13, further comprising the step of delaying the first clock signal to produce the fixed delay clock signal.

15. The method of claim 14, wherein the step of altering includes a step of increasing a variable delay of the variable delay clock signal.

16. The method of claim 15, wherein the step of detecting includes producing the control signal when the variable delay is at least one period of the first clock signal.

17. The method of claim 16, wherein the step of altering includes a step of incrementing the values of the programming signal with a second clock signal to produce the variable delay clock signal at a frequency of the second clock signal.

* * * * *